(12) United States Patent
Katkar et al.

(10) Patent No.: US 9,741,696 B2
(45) Date of Patent: *Aug. 22, 2017

(54) THERMAL VIAS DISPOSED IN A SUBSTRATE PROXIMATE TO A WELL THEREOF

(71) Applicant: Invensas Corporation, San Jose, CA (US)

(72) Inventors: Rajesh Katkar, San Jose, CA (US); Arkalgud R. Sitaram, Cupertino, CA (US); Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 12 days.

This patent is subject to a terminal disclaimer.

(21) Appl. No.: 15/174,338

(22) Filed: Jun. 6, 2016

(65) Prior Publication Data

US 2016/0284672 A1 Sep. 29, 2016

Related U.S. Application Data

(63) Continuation of application No. 14/201,585, filed on Mar. 7, 2014, now Pat. No. 9,368,479.

(51) Int. Cl.
*H01L 25/065* (2006.01)
*H01L 23/538* (2006.01)
(Continued)

(52) U.S. Cl.
CPC ........ *H01L 25/0657* (2013.01); *H01L 21/308* (2013.01); *H01L 21/30604* (2013.01); *H01L 21/31105* (2013.01); *H01L 21/76897* (2013.01); *H01L 21/76898* (2013.01); *H01L 23/3675* (2013.01); *H01L 23/3677* (2013.01); *H01L 23/481* (2013.01); *H01L 23/5386* (2013.01);
(Continued)

(58) Field of Classification Search
CPC ...... H01L 23/42; H01L 23/3675; H01L 25/50
See application file for complete search history.

(56) References Cited

U.S. PATENT DOCUMENTS 7,494,910 B2 2/2009 Mouli
8,618,647 B2 12/2013 Fisch
(Continued)

OTHER PUBLICATIONS

International Search Report and Written Opinion for PCT Appln. No. PCT/US2015/019517, dated May 15, 2015.

*Primary Examiner* — Matthew Landau
*Assistant Examiner* — Krista Soderholm (57) ABSTRACT

An apparatus relates generally to a three-dimensional stacked integrated circuit. In such an apparatus, the three-dimensional stacked integrated circuit has at least a first die and a second die interconnected to one another using die-to-die interconnects. A substrate of the first die has at least one thermal via structure extending from a lower surface of the substrate toward a well of the substrate without extending to the well and without extending through the substrate. A first end of the at least one thermal via structure is at least sufficiently proximate to the well of the substrate for conduction of heat away therefrom. The substrate has at least one through substrate via structure extending from the lower surface of the substrate to an upper surface of the substrate. A second end of the at least one thermal via structure is coupled to at least one through die via structure of the second die for thermal conductivity.

13 Claims, 10 Drawing Sheets

(51) Int. Cl.
*H01L 21/768* (2006.01)
*H01L 23/48* (2006.01)
*H01L 21/306* (2006.01)
*H01L 21/308* (2006.01)
*H01L 21/311* (2006.01)
*H01L 25/00* (2006.01)
*H01L 23/367* (2006.01)
*H01L 23/42* (2006.01)

(52) U.S. Cl.
CPC ............. *H01L 25/50* (2013.01); *H01L 23/42* (2013.01); *H01L 2224/16145* (2013.01); *H01L 2224/16225* (2013.01); *H01L 2224/32225* (2013.01); *H01L 2224/73204* (2013.01); *H01L 2224/73253* (2013.01); *H01L 2225/06541* (2013.01); *H01L 2225/06589* (2013.01); *H01L 2924/15311* (2013.01); *H01L 2924/16152* (2013.01)

(56) References Cited

U.S. PATENT DOCUMENTS

| | | |
|---|---|---|
| 8,735,286 B2 | 5/2014 | Kant |
| 2011/0215457 A1 | 9/2011 | Park |

THERMAL VIAS DISPOSED IN A SUBSTRATE PROXIMATE TO A WELL THEREOF

CROSS-REFERENCE TO RELATED APPLICATION(S)

This application is a continuation of, and hereby claims priority to, pending U.S. patent application Ser. No. 14/201,585, filed on Mar. 7, 2014, which is incorporated by reference herein in its entirety for all purposes consistent herewith.

FIELD

The following description relates to integrated circuits ("ICs"). More particularly, the following description relates to thermal vias disposed in a substrate proximate to a well thereof for an IC.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active devices. Furthermore, an interposer may be formed like a PWB, namely without any circuit elements such as capacitors, resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example. Conventionally, a stacked die or an individual die has issues with removing heat.

Accordingly, it would be desirable and useful to provide means to remove heat from a die stack or an individual die.

BRIEF SUMMARY

An apparatus relates generally to a three-dimensional stacked integrated circuit. In such an apparatus, the three-dimensional stacked integrated circuit has at least a first die and a second die interconnected to one another using die-to-die interconnects. A substrate of the first die has at least one thermal via structure extending from a lower surface of the substrate toward a well of the substrate without extending to the well and without extending through the substrate. A first end of the at least one thermal via structure is at least sufficiently proximate to the well of the substrate for conduction of heat away therefrom. The substrate has at least one through substrate via structure extending from the lower surface of the substrate to an upper surface of the substrate. A second end of the at least one thermal via structure is coupled to at least one through die via structure of the second die for thermal conductivity.

An apparatus relates generally to a substrate. In such an apparatus, the substrate has a plurality of thermal via structures extending from a lower surface of the substrate toward a well of the substrate without extending to the well and without extending through the substrate. First ends of the plurality of thermal via structures are at least sufficiently proximate to the well of the substrate for conduction of heat away therefrom. The substrate has a through substrate via structure extending from the lower surface of the substrate to an upper surface of the substrate. Second ends of the plurality of thermal via structures are coupled to a heat sink.

A method relates generally to a substrate. In such a method, a patterned masking layer is formed on a surface of the substrate. The substrate has thereon a stack of inter-dielectric layers and metal layers on an opposite surface with respect to the surface of the substrate. Vias are etched in the substrate through openings in the patterned masking layer. The vias extend from the surface toward a well of the substrate without extending to the well and without extending through the substrate. Ends of the vias are at least sufficiently proximate to the well of the substrate for conduction of heat away therefrom. The vias are plated to provide thermal via structures.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figure 1A:
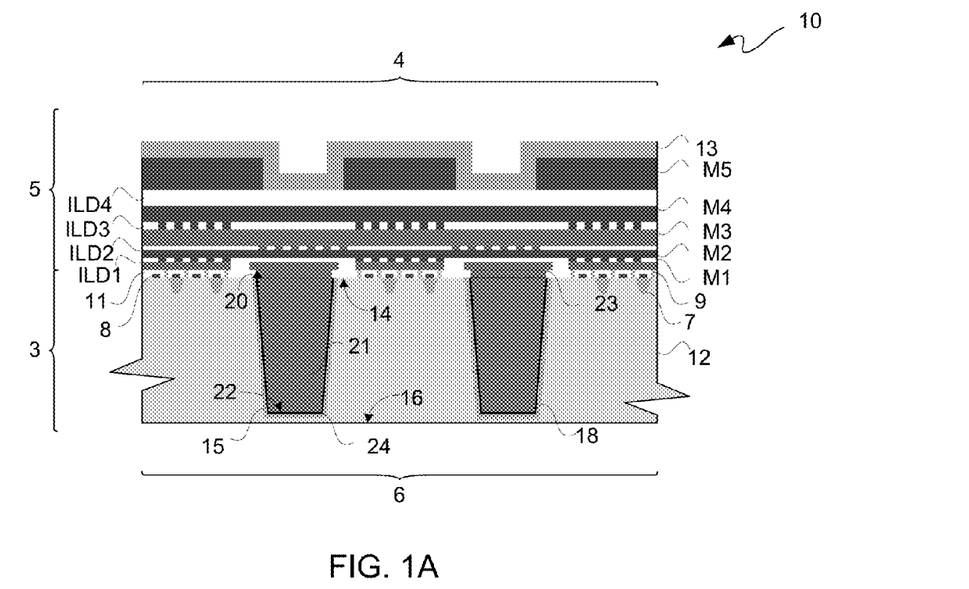
FIG. 1A is a schematic diagram of a cross-sectional view depicting an exemplary portion of an in-process wafer for providing an integrated circuit ("IC").

FIG. 1A is a schematic diagram of a cross-sectional view depicting an exemplary portion of an in-process wafer for providing an IC 10 component. IC 10 includes a substrate 12 of a semiconductor material such as silicon (Si), gallium arsenide (GaAs), polymeric, ceramic, carbon-based substrates such as diamond, a silicon carbon (SiC), germanium (Ge), $Si_{1-x}Ge_x$, or the like. Even though a semiconductor substrate 12 as provided from an in-process wafer is generally described below, any sheet or layer semiconductor material or dielectric material, such as ceramic or glass for example, may be used as a substrate. Furthermore, even though an IC 10 is described, any microelectronic component that includes one or more through-substrate via structures may be used.

Substrate 12 includes an upper surface 14 and a lower surface 16 that extend in lateral directions and are generally parallel to each other at a thickness of substrate 12. Use of terms such as "upper" and "lower" or other directional terms is made with respect to the reference frame of the figures and is not meant to be limiting with respect to potential alternative orientations, such as in further assemblies or as used in various systems.

Upper surface 14 may generally be associated with what is referred to as a "front side" 4 of an in-process wafer, and lower surface 16 may generally be associated with what is referred to as a "backside" 6 of an in-process wafer. Along those lines, a front-side 4 of an in-process wafer may be used for forming what is referred to as front-end-of-line ("FEOL") structures 3 and back-end-of-line ("BEOL") structures 5. Generally, FEOL structures 3 may include shallow trench isolations ("STI") 7, transistor gates 8, transistor source/drain regions (not shown), transistor gate dielectrics (not shown), contact etch stop layer ("CESL"; not shown), a pre-metallization dielectric or pre-metal dielectric ("PMD") 11, and contact plugs 9, among other FEOL structures. A PMD 11 may be composed of one or more layers. Generally, BEOL structures 5 may include one or more inter-level dielectrics ("ILDs") and one or more levels of metallization ("M"). In this example, there are four ILDs, namely ILD1, ILD2, ILD3, and ILD4; however, in other configurations there may be fewer or more ILDs. Furthermore, each ILD may be composed of one or more dielectric layers. In this example, there are five levels of metallization, namely M1, M2, M3, M4, and M5; however, in other configurations there may be fewer or more levels of metallization. Additionally, metal from a metallization level may extend through one or more ILDs, as is known. Furthermore, each level of metallization may be composed of one or more metal layers. A passivation level 13 may be formed on a last metallization layer. Such passivation level 13 may include one or more dielectric layers, and further may include an anti-reflective coating ("ARC"). Furthermore, a redistribution layer ("RDL") may be formed on such passivation level. Conventionally, an RDL may include: a dielectric layer, such as a polyimide layer for example; another metal layer on such dielectric layer and connected to a bond pad of a metal layer of a last metallization level; and another dielectric layer, such as another polyimide layer for example, over such RDL metal layer while leaving a portion thereof exposed to provide another bond pad. A terminal opening may expose such other bond pad of such RDL metal layer. Thereafter, a solder bump or wire bond may be conventionally coupled to such bond pad.

As part of a FEOL or BEOL structure formation, a plurality of via structures 18 may extend within openings formed in substrate 12 which extend into substrate 12. Via structures 18 may be generally in the form of any solid of any shape formed by filling an opening formed in substrate 12. Examples of such solid shapes generally include cylindrical, conical, frustoconical, rectangular prismatic, cubic, or the like. Examples of openings for via structures, vias, and processes for the fabrication thereof, may be found in U.S. patent application Ser. No. 13/193,814 filed Jul. 29, 2011, and U.S. patent application Ser. Nos. 12/842,717 and 12/842,651 both filed on Jul. 23, 2010, and each of these patent applications is hereby incorporated by reference herein for all purposes to the extent same is consistent with the description hereof.

Conventionally, via structures 18 may extend from upper surface 14 down toward lower surface 16, and after a backside reveal, via structures 18 may extend between surfaces 14 and 16, as effectively thickness of substrate 12 may be thinned so as to reveal lower end surfaces of via structures 18, as described below in additional detail. Via structures 18 extending through substrate 12 between surfaces 14 and 16, though they may extend above or below such surfaces, respectively, may be referred to as through-substrate-vias. As substrates are often formed of silicon, such through-substrate-vias are commonly referred to as TSVs, which stands for through-silicon-vias.

Such openings formed in substrate 12 may be conformally coated, oxidized, or otherwise lined with a liner or insulator 15. Conventionally, liner 15 is silicon dioxide; however, a silicon oxide, a silicon nitride, or another dielectric material may be used to electrically isolate via structures 18 from substrate 12. Generally, liner 15 is an insulating or dielectric material positioned between any and all conductive portions of a via structure 18 and substrate 12 such that an electronic signal, a ground, a supply voltage, or the like carried by such via structure 18 is not substantially leaked into substrate 12, which may cause signal loss or attenuation, shorting, or other circuit failure.

Overlying a liner 15 may be a barrier layer 24. Generally, barrier layer 24 is to provide a diffusion barrier with respect to a metallic material used to generally fill a remainder of an opening in which a via structure 18 is formed. Barrier layer 24 may be composed of one or more layers. Furthermore, a barrier layer 24 may provide a seed layer for subsequent electroplating or other deposition, and thus barrier layer 24 may be referred to as a barrier/seed layer. Moreover, barrier layer 24 may provide an adhesion layer for adherence of a subsequently deposited metal. Thus, barrier layer 24 may be a barrier/adhesion layer, a barrier/seed layer, or a barrier/adhesion/seed layer. Examples of materials that may be used for barrier layer 24 include tantalum (Ta), tantalum nitride (TaN), palladium (Pd), titanium nitride (TiN), TaSiN, compounds of Ta, compounds of Ti, compounds of nickel (Ni), compounds of copper (Cu,), compounds of cobalt (Co), or compounds of tungsten (W), among others.

Via structures 18 may generally consist of a metallic or other conductive material generally filling a remaining void in an opening formed in substrate 12 to provide a via conductor 21. In various examples, a via conductor 21 of a via structure 18 may generally consist of copper or a copper alloy. However, a via conductor 21 may additionally or alternatively include one or more other conductive materials such as tantalum, nickel, titanium, molybdenum, tungsten, aluminum, gold, or silver, including various alloys or compounds of one or more of the these materials, and the like. A via conductor 21 may include non-metallic additives to control various environmental or operational parameters of a via structure 18.

Via structures 18 may each include an upper end contact surface 20 which may be level with upper surface 14 of substrate 12 and a lower end contact surface 22 which may be level with lower surface 16 of substrate 12 after a backside reveal. End surfaces 20 and 22 may be used to interconnect via structures 18 with other internal or external components, as below described in additional detail.

In this example, upper end contact surface 20 of via conductors 21 are interconnected to M1 through a respective contact pad 23. Contact pads 23 may be formed in respective openings formed in PMD 11 in which M1 extends. However, in other configurations, one or more via conductors 21 may extend to one or more other higher levels of metallization through one or more ILDs. Furthermore, via structure 18 is what may be referred to as a front side TSV, as an opening used to form via structure is initially formed by etching from a front side of substrate 12.

Figure 1B:
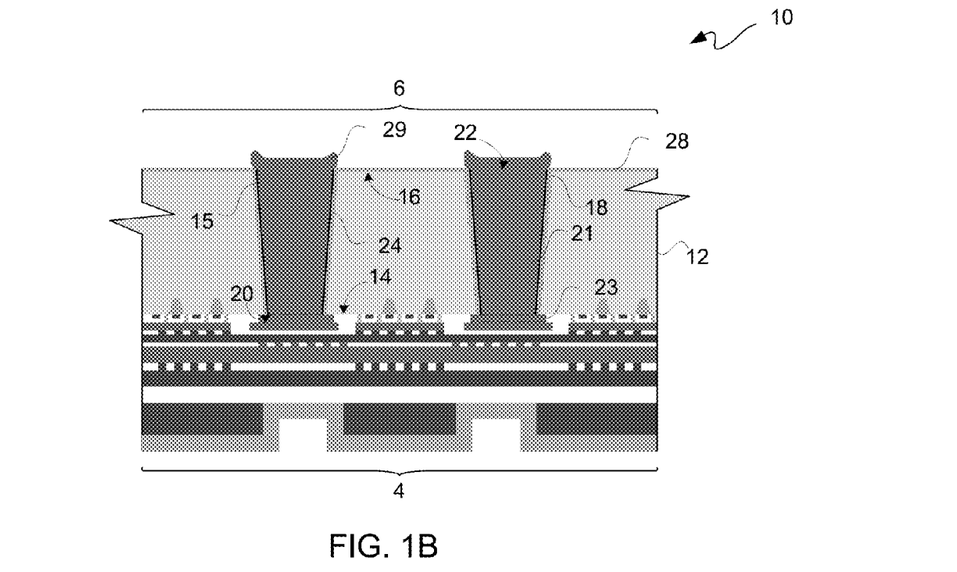
FIG. 1B is a schematic diagram of a cross-sectional view depicting an exemplary portion of an in-process wafer for providing another IC.

However, a via structure may be a backside TSV, as generally indicated in FIG. 1B, where there is shown a schematic diagram of a cross-sectional view depicting an exemplary portion of an in-process wafer for providing another IC 10. Fabrication of a backside TSV is generally referred to as a "via last approach," and accordingly fabrication of a front side TSV is generally referred to as a "via first approach." Furthermore, a "via middle approach" may be used. A "via middle approach" is likewise a front side approach to via formation, but referred to as "middle" as vias are made after FEOL operations, but before BEOL operations.

IC 10 of FIG. 1B includes a plurality of via structures 18, which are backside TSVs. For a backside TSV for via structure 18, liner 15 may be a deposited polymer into a "donut" silicon trench etch and deposited on lower surface 16 as a passivation layer 28, followed by a central silicon trench etch to remove an inner portion of the "donut" silicon trench, and followed by a seed layer deposition before patterning and electroplating to provide via conductors 21 having respective solder bump pads or landings 29. Optionally, a conventional anisotropic silicon etch may be used prior to depositing and patterning a polymer isolation layer as liner 15.

For purposes of clarity by way of example and not limitation, it shall be assumed that front side TSVs are used, as the following description is generally equally applicable to backside TSVs.

Figure 1C:
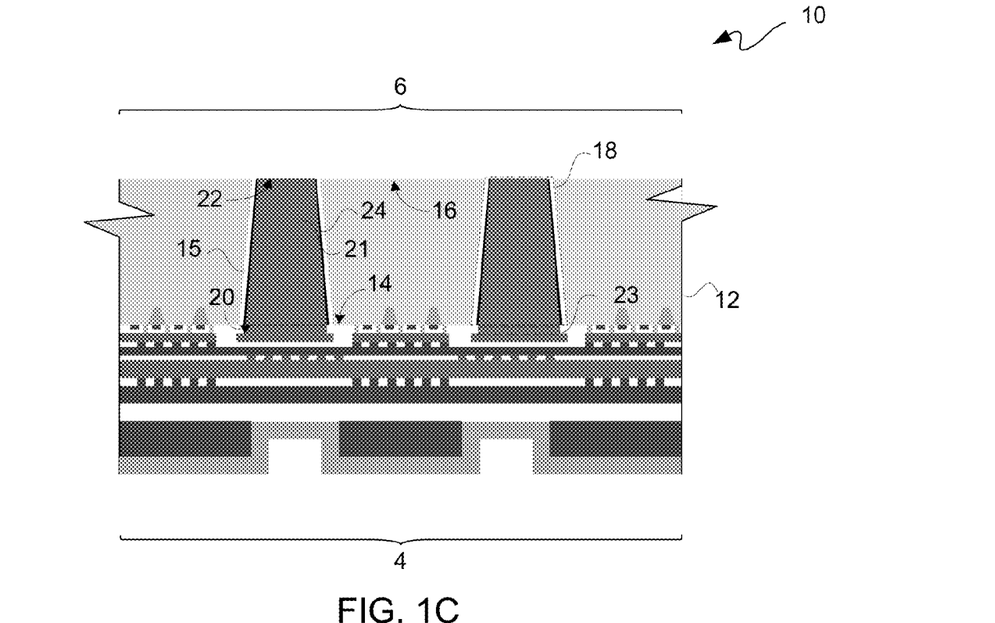
FIG. 1C is the diagram of FIG. 1A with the IC vertically flipped after chemical-mechanical-polishing of a lower surface of a substrate of the IC.

FIG. 1C is the diagram of FIG. 1A with IC 10 after a chemical-mechanical-polishing ("CMP") of a lower surface 16 of a substrate 12. Such CMP may be performed to temporarily reveal lower end contact surface 22, and thus portions of liner 15 and barrier layer 24 previously underlying lower end contact surface 22 may be removed by CMP. Thus, in this example, lower end contact surface 22 may be coplanar and level with lower surface 16.

Figure 1D:
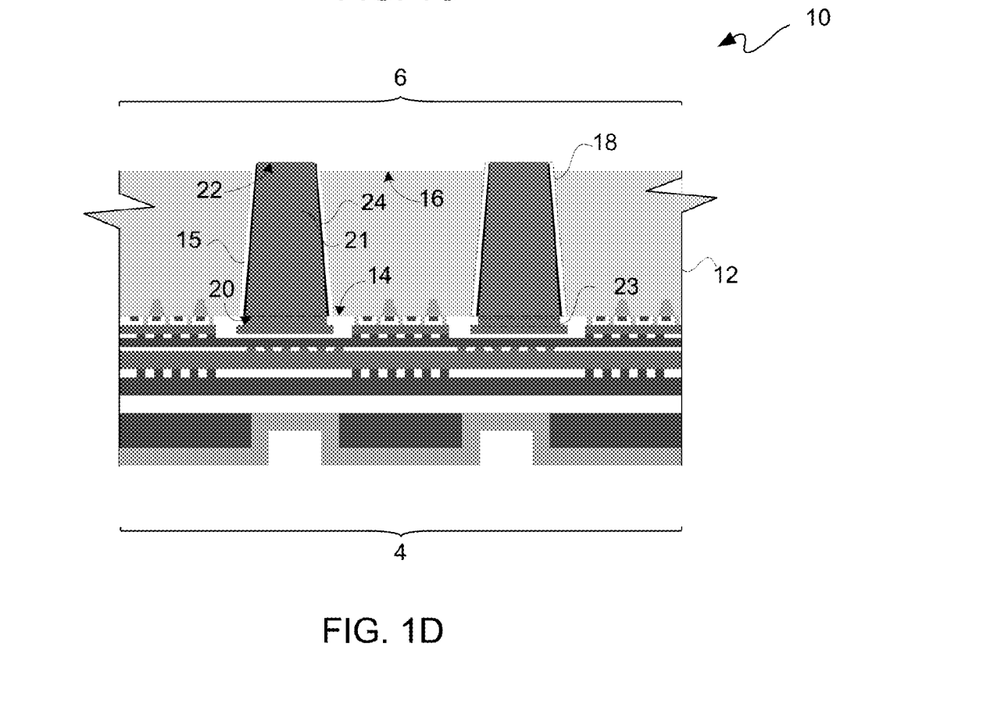
FIG. 1D is the diagram of FIG. 1A with the IC vertically flipped after a backside etch of a lower surface of a substrate of the IC to reveal a lower end contact surface of a via conductor thereof.

FIG. 1D is the diagram of FIG. 1A with IC 10 after a backside etch of a lower surface 16 of substrate 12 to temporarily reveal a lower end contact surface 22 of a via conductor 21. In this example, lower end contact surface 22 may be coplanar with lower surface 16; however, as via conductor 21, and optionally barrier layer 24, may protrude from substrate 12 after a backside reveal etch, lower end contact surface 22 in this example is not level with lower surface 16. For purposes of clarity and not limitation, IC 10 of FIG. 1D shall be further described, as the following description may likewise apply to IC 10 of FIG. 1C.

Figure 1E:
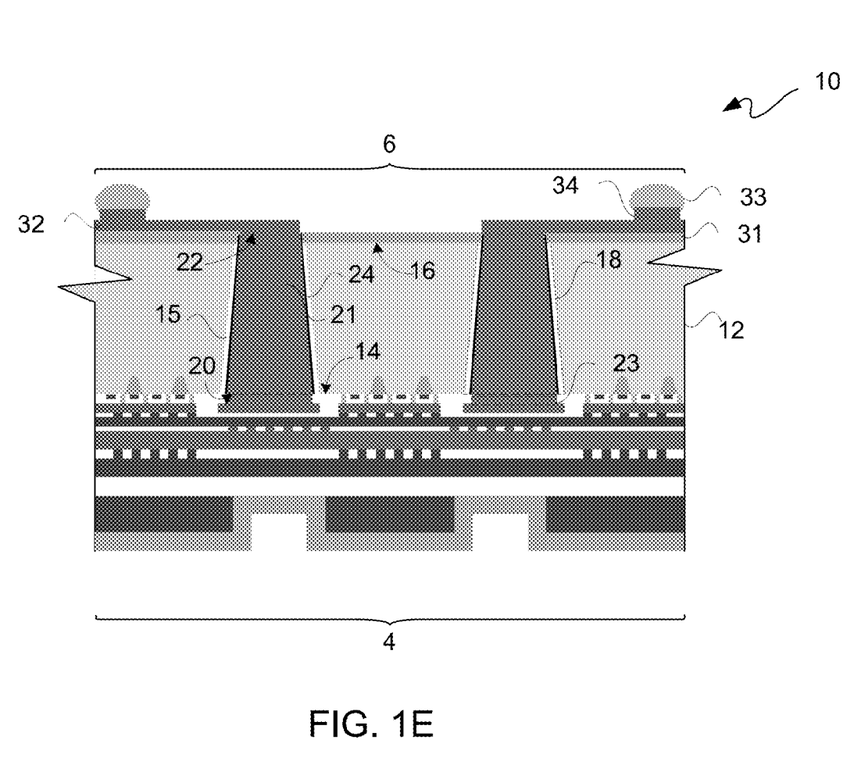
FIG. 1E is the diagram of FIG. 1D with a lower surface of the IC having formed thereon a passivation layer, which may be formed of one or more dielectric layers.

FIG. 1E is the diagram of FIG. 1D with a lower surface 16 of a substrate 12 having formed thereon a passivation layer 31, which may be formed of one or more dielectric layers. Furthermore, passivation layer 31 may be a polymer layer. For example, passivation layer 31 may be a benzocyclobutene ("BCB") layer or a combination of a silicon nitride layer and a BCB layer. In some applications, passivation layer 31 may be referred to as an inter-die layer. A metal layer 32, such as a copper, copper alloy, or other metal previously described, may be formed on passivation layer 31 and on lower end contact surfaces 22 of via conductors 21. This metal layer 32 may be an RDL metal layer. Balls 33 may be respectively formed on bonding pads 34, where such pads may be formed on or as part of metal layer 32. Balls 33 may be formed of a bonding material, such as solder or other bonding material. Balls 33 may be microbumps, C4 bumps, ball grid array ("BGA") balls, or some other die interconnect structure. In some applications, metal layer 32 may be referred to as a landing pad.

More recently, TSVs have been used to provide what is referred to as three-dimensional ("3D") ICs or "3D ICs." Generally, attaching one die to another using, in part, TSVs may be performed at a bond pad level or an on-chip electrical wiring level. ICs 10 may be diced from a wafer into single dies. Such single dies may be bonded to one another or bonded to a circuit platform, as previously described. For purposes of clarity by way of example and not limitation, it shall be assumed that an interposer is used for such circuit platform.

Interconnection components, such as interposers, may be in electronic assemblies for a variety of purposes, including facilitating interconnection between components with different connection configurations or to provide spacing between components in a microelectronic assembly, among others. Interposers may include a semiconductor layer, such as of silicon or the like, in the form of a sheet or layer of material or other substrate having conductive elements such as conductive vias extending within openings which extend through such layer of semiconductor material. Such conductive vias may be used for signal transmission through such interposer. In some interposers, ends of such vias may be used as contact pads for connection of such interposer to other microelectronics components. In other examples, one or more RDLs may be formed as part of such interposer on one or more sides thereof and connected with one or both ends of such vias. An RDL may include numerous conductive traces extending on or within one or more dielectric sheets or layers. Such traces may be provided in one level or in multiple levels throughout a single dielectric layer, separated by portions of dielectric material within such RDL. Vias may be included in an RDL to interconnect traces in different levels of such RDL.

Figure 2A:
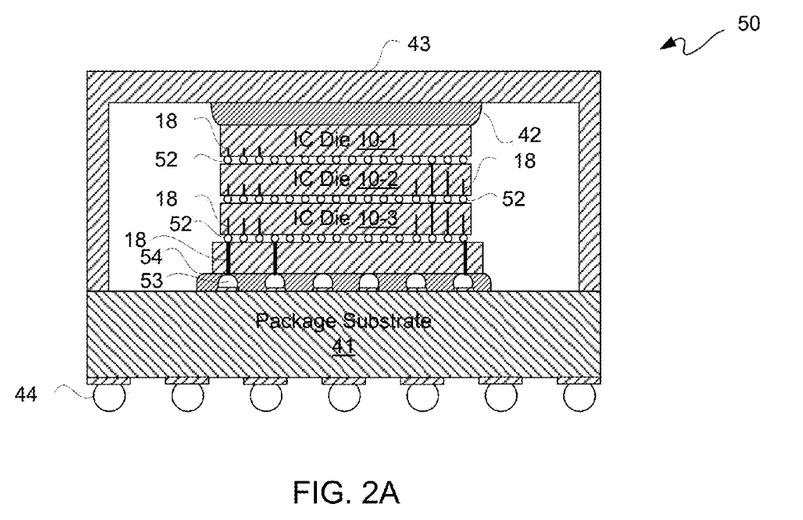
FIG. 2A is a block diagram of a cross-sectional view depicting an exemplary three-dimensional ("3D") IC packaged component with via structures.

FIG. 2A is a block diagram of a cross-sectional view depicting an exemplary 3D IC packaged component 50 with via structures 18. While a stacked die or a package-on-package die may include TSV interconnects, use of via structures 18 for a 3D IC packaged component 50 is described for purposes of clarity by way of example. In this example of a 3D IC packaged component 50, there are three ICs 10, namely ICs 10-1, 10-2, and 10-3, stacked one upon the other. In other implementations, there may be fewer or more than three ICs 10 in a stack. ICs 10 may be bonded to one another using microbumps 52 or flip-chip solder bumps. Optionally, Cu pillars extending from a backside of a die may be used. Some of these microbumps 52 may be interconnected to via structures 18. For example, a Cu/Sn microbump transient liquid phase ("TLP") bonding technology may be used for bonding ICs to one another. Thus, interconnect layers may be on one upper or lower side or both upper and lower sides of an IC 10 of a 3D stack.

A bottom IC 10-3 of such ICs in a 3D stack optionally may be coupled to an interposer or interposer die 40. Interposer 40 may be an active die or a passive die. For purposes of clarity and not limitation, it shall be assumed that interposer 40 is a passive die. IC 10-3 may be coupled to interposer 40 by microbumps 52. Interposer 40 may be coupled to a package substrate 41. Package substrate 41 may be formed of thin layers called laminates or laminate substrates. Laminates may be organic or inorganic. Examples of materials for "rigid" package substrates include an epoxy-based laminate such as FR4, a resin-based laminate such as bismaleimide-triazine ("BT"), a ceramic substrate, a glass substrate, or other form of package substrate. An under fill 54 for a flip chip attachment may encapsulate C4 bumps or other solder balls 53 used to couple interposer 40 and package substrate 41. A spreader/heat sink ("heat sink") 43 may be attached to package substrate 41, and such heat sink 43 and substrate package 41 in combination may encase ICs 10 and interposer 40 of such 3D stack. A thermal paste 42 may couple an upper surface of IC 10-1 on top of such 3D stack to an upper internal surface of such heat sink 43. Ball grid array ("BGA") balls or other array interconnects 44 may be used to couple package substrate 41 to a circuit platform, such as a PCB for example.

Figure 2B:
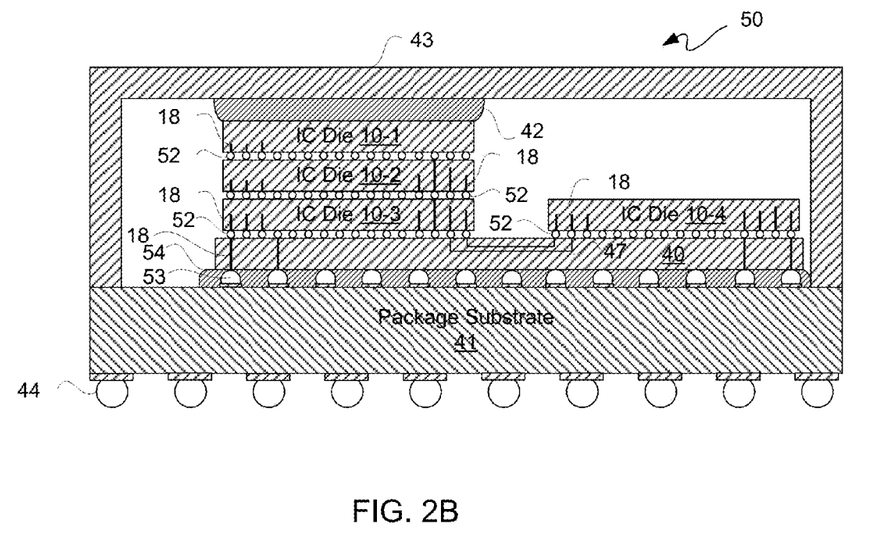
FIG. 2B is a block diagram of a cross-sectional view depicting another exemplary 3D IC packaged component with via structures.

FIG. 2B is a block diagram of a cross-sectional view depicting another exemplary 3D IC packaged component 50 with via structures 18. 3D IC packaged components 50 of FIGS. 2A and 2B are the same except for the following differences; in FIG. 2B, another IC 10-4 is separately coupled via microbumps 52 to interposer 40, where IC 10-4 is not coupled in the stack of ICs 10-1, 10-2, and 10-3. Furthermore, interposer 40 includes metal and via layers for providing wires 47 for interconnecting ICs 10-3 and 10-4.

Furthermore, interposer 40 includes via structures 18 coupled to IC 10-4 through microbumps 52.

3D wafer-level packaging ("3D-WLP") may be used for interconnecting two or more ICs, one or more ICs to an interposer, or any combination thereof, where interconnects thereof may use via structures 18. Optionally, ICs may be interconnected die-to-die ("D2D") or chip-to-chip ("C2C"), where interconnects thereof may use via structures 18. Further, optionally, ICs may be interconnected die-to-wafer ("D2W") or chip-to-wafer ("C2W"), where interconnects thereof may use via structures 18. Accordingly, any of a variety of die stacking or chip stacking approaches may be used to provide a 3D stacked IC ("3D-SIC" or "3D-IC").

Figure 3:
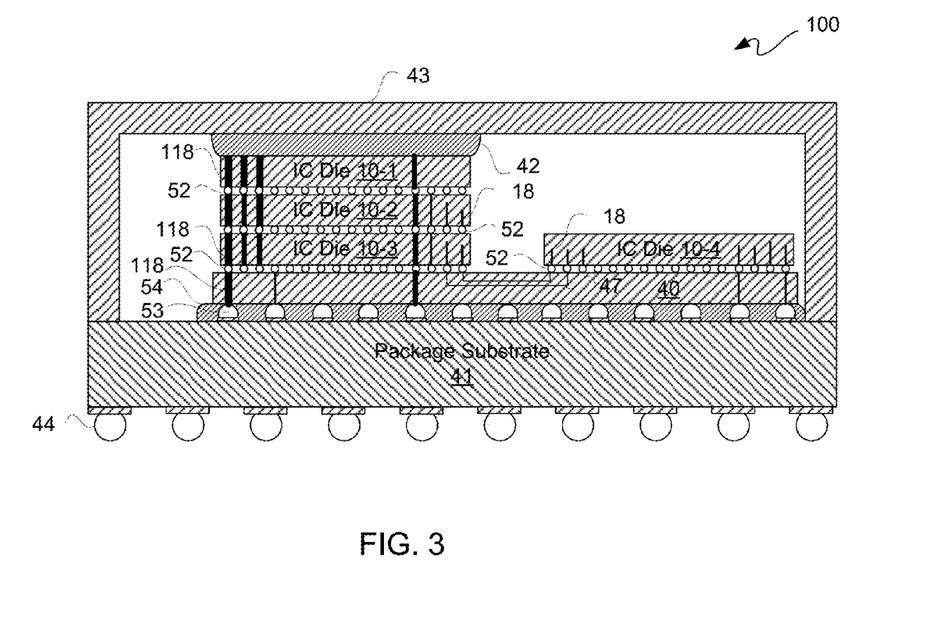
FIG. 3 is a block diagram of a cross-sectional view depicting exemplary 3D IC packaged component 100 with via structures.

FIG. 3 is a block diagram of a cross-sectional view depicting exemplary 3D IC packaged component 100 with via structures. Again, 3D IC packaged component 100 includes multiple dies, such as for a system-in-a-package ("SiP") or an interposer, namely generally for one or more dies used for or in D2D, W2D, or WLP interconnections for forming a 3D IC. Along those lines, the particular configuration illustratively depicted in this example in FIG. 3 may, though need not, be used. This example is provided for purposes of clarity by way of example and not limitation, as it shall become apparent that a more or less complex configuration may be used.

For a 3D stacked IC, there is at least a first die and a second die interconnected to one another through die-to-die interconnects. For example, there may be at least an IC die 10-1 interconnected to an IC die 10-2 through microbumps 52. Or, for example, there may be at least an interposer 40 and an IC die 10-3 interconnected to one another through microbumps 52. IC dies 10-1 through 10-3, as well as substrate 40, may each have thermal via structures ("thermal vias") 118 for conducting heat in a generally vertical direction in 3D IC packaged component 100. Along those lines, heat may be conducted from one die to another die in a 3D stacked IC, and such heat may be provided to a heat sink, such as for example to thermal paste 42 and then to heat sink or heat spreader 43. In this example, heat sink 43 is part of 3D IC packaged component 100; however, in another configuration, an external heat sink may be coupled to heat sink 43. Furthermore, a 3D stacked IC may be encapsulated, and in such configuration thermal paste 42 may be provided to an outer surface of such encapsulation for thermal conduction and adhesion of an external heat sink.

Furthermore, one or more dies may have via structures 18 which are for conducting a signal, a supply power or supply voltage, or a ground. With respect to a ground, such via structures 18 may be both signal vias and thermal vias. For purposes of clarity and not limitation, via structures as described below are identified according to their purpose, such as either thermal vias or signal vias; however, in instances where vias are grounds used for grounding and thermally conducting, such vias may be identified as signal vias coupled for thermal conduction.

Figure 4A:
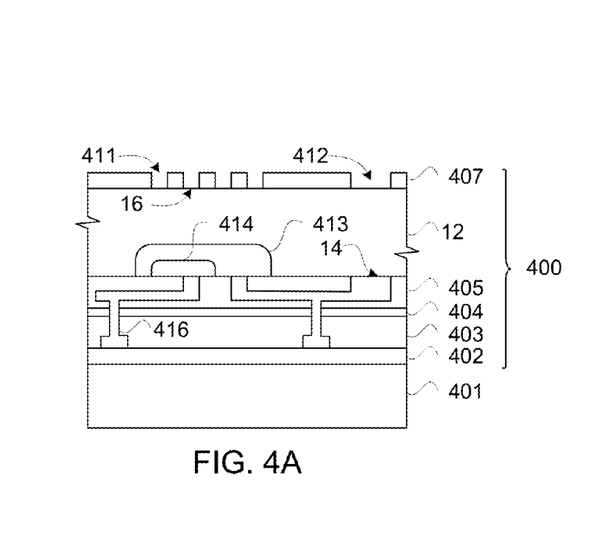
FIGS. 4A through 4D is a schematic diagram of a cross-sectional view depicting an exemplary portion of a successively processed in-process die for a 3D stacked integrated circuit ("IC") or stacked die coupled to a handling platform ("wafer").
Figure 4B:
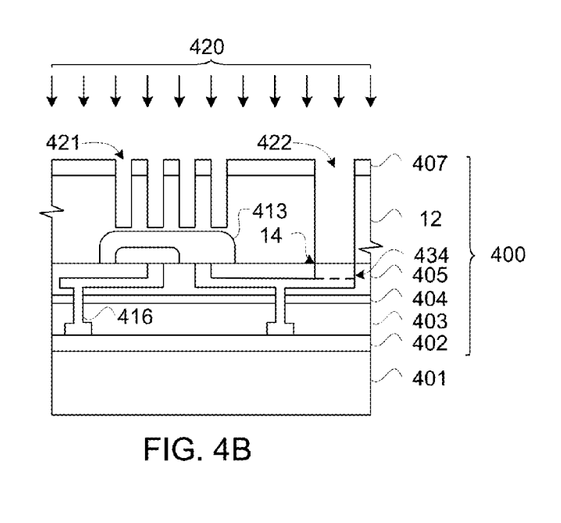
Figure 4C:
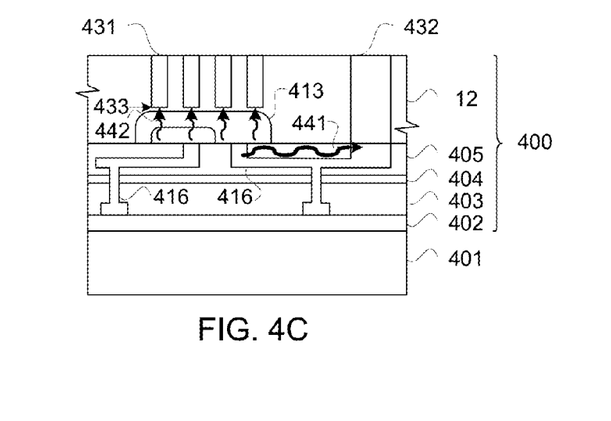
Figure 4D:
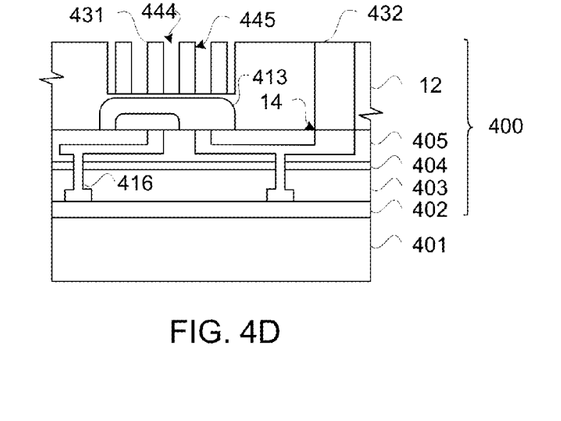

With the above understanding in mind, various configurations of 3D stacked ICs are further described. FIG. 4A is a schematic diagram of a cross-sectional view depicting an exemplary portion of an in-process die 400 for a 3D stacked IC coupled to a handling platform ("wafer") 401. In process die 400 is illustratively depicted in an inverted position for via last processing, namely for processing a backside of a wafer or die. FIGS. 4B through 4D are the schematic diagram of FIG. 4A after successive processing operations for formation of this exemplary die 400. Accordingly, with simultaneous reference to FIGS. 4A through 4D, formation of die 400 is further described.

Die 400 may include a passivation layer 402, multiple metal and ILD layers such as layers 403 through 405 for example, to form conductive pathways 416 to substrate 12, including without limitation wells 413 and 414 formed in substrate 12. An upper surface 14 of substrate 12 may be adjacent to such conductive pathways 416. Even though two wells 413 and 414 are illustratively depicted, fewer or more than two well may be used. For example, even though a double-well configuration is illustratively depicted, a single well or triple well or other well configuration may be used. With respect to description of thermal vias extending toward without contacting a well, such well at issue is an outermost well in instances of a multi-well configuration. It should be understood that transistor wells as illustratively depicted are generally depicted. Along those lines, one transistor may be only a few hundred nanometers wide or less, so a depiction of multiple thermal vias proximate to a well may indicate that such thermal vias are just a few nanometers wide for example. Furthermore, a hot spot on a die may be due to operational heat from tens to hundreds of thousands, or more, of such individual wells, and thus a hot spot could extend from tens to hundreds, or more, of microns along a substrate.

After a thinning operation to thin substrate 12, such as CMP along a lower surface 16 for example, a mask layer 407 may be deposited and patterned to form openings 411 and 412 along a lower surface 16 of substrate 12. Openings 411 and 412 may be used for etching vias 421 and 422, respectively, with an etch 420. For purposes of clarity by way of example and not limitation, it shall be assumed that etch 420 is a form of deep reactive-ion etching ("DRIE"). A plating operation, such as copper plating, may be used to form via structures 431 and 432 respectively in vias 421 and 422.

Figure 4E:
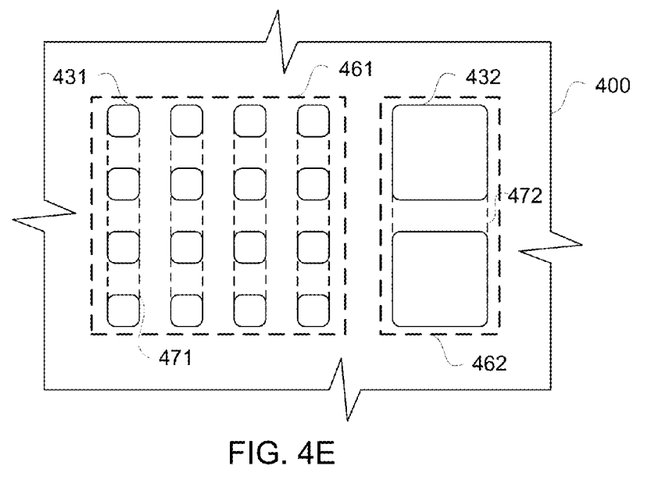
FIG. 4E is a schematic diagram of a top view depicting an exemplary portion of an in-process die, such as of FIG. 4C for example.

FIG. 4E is a schematic diagram of a top view depicting an exemplary portion of an in-process die 400, such as of FIG. 4C for example. Via structures 431 and 432 may be formed in an array 461 and an array 462, respectively. Even though squares with rounded corners are illustratively depicted for a top view of via structures 431 and 432, other forms of shapes, such as circles, ellipses, rectangles, polygons, or other shapes, may be used. Furthermore, the numbers of via structures 431 and 432 may be fewer or more than those illustratively depicted. Additionally or optionally, channels, such as generally indicated by dashed lines 471 and 472, may be formed for via structures 431 and 432. Along those lines, an array of channels may be formed for vias. Furthermore, structures other than or including channels may be used, such as concentric rings, zig-zags, or other geometric forms. Furthermore, vias structures 431 and 432 may, though need not be, completely filled. For example, vias 421 and 422 may be conformal plated leaving voids in via conductors of vias structures 431 and/or 432. Substrate 12 of die 400 may have a plurality of thermal vias 431 extending from a lower surface 16 of such substrate 12 toward a well 413 without extending to such well 413 and thus without extending through such substrate 12, namely "blind thermal vias". Optionally, via structures 431 may be lined with a liner layer and a barrier layer, as previously described herein. A portion of such liner layer and/or barrier layers may optionally be removed to provide via structures 431 as fins, as generally indicated in FIG. 4D, for die 400 a top die in a die stack. Along those lines, air gaps 444 may be located between sidewalls 445 of thermal vias 431 and substrate 12 to provide fins.

Ends 433 of thermal vias 431 may be at least sufficiently proximate to well 413 of substrate 12 for conduction of heat away therefrom. Along those lines, well 413 may be associated with an identified "hot spot" of die 400 during operation. Spacing or gapping between ends 433 and well 413 may be less than or equal to approximately 20 microns in distance. In some implementations, such spacing between ends 433 and well 413 may be 3 microns or less. However, an active part of transistors for example may generally be limited to approximately 5 microns or less in depth into substrate 12, and so a separation larger than 3 microns may be used so as to avoid introducing stress that would negatively impact transistor performance.

During formation of thermal vias 431 for such vias formed after BEOL, namely after thermal budget is substantially limited due to having completed BEOL for a "via last flow," one or more thermal vias 431 may be etched simultaneous with etch 420 to form one or more signal vias, such as signal via 432 for example. Aspect ratio of via 422 may be substantially larger than aspect ratio of a via 421 such that aspect ratio dependent etch behavior of a DRIE may be utilized to etch via 422 substantially faster than each of vias 421. Conversely, aspect ratio of each of vias 421 may be substantially smaller than aspect ratio of via 422 to provide a high-density of blind thermal vias proximate to well 413. For this example, widths of thermal vias 431 may be in a range of approximately 0.5 to 100 microns. Along those lines, for a thin die, such as approximately 10 microns thick, 0.5 to 1 micron widths of thermal vias 431 may be used. Thermal vias 431 may be formed as a high-density array with a pitch in a range of approximately 1 to 200 microns. Moreover, for this example, width of signal via 432 may be in a range of approximately 1 to 5 times a width of thermal vias 431. For example, for approximately a 100 micron thick die, assuming transistors are approximately within 5 microns deep, aspect ratios may not be significantly different, and so blind thermal vias may be approximately 90 microns deep and through die vias may be approximately 100 microns deep.

In this example, substrate 12 has a signal via 432 which is a through substrate via, as it extends between surfaces 14 and 16 of substrate 12. Though thermal vias 431 and signal via 432 are illustratively depicted as being completely filled, they may not be as previously described. Accordingly, in other configurations, there may be voids and/or vias may be lined with a thermally and electrically conductive material, such as another metal, a metal compound or alloy for example, or other material having sufficient electrical and thermal conductive properties. Furthermore, even though copper has been described herein as such thermally and electrically conductive material, other thermally and electrically conductive materials may be used in other examples. A pad 434 or other portion of conductive pathway 416 formed along upper surface 14 of substrate 12 may provide an etch stop layer for DRIE to provide a through substrate via 422. Depths of thermal vias 431 may be approximately 1 to 200 microns, which is approximately 1 to 20 microns less than depth of signal via 432. Signal via 432 may be for a ground, and thus may be coupled to additionally provide a thermal via. Optionally, through substrate via 432 may not be a signal via, but may instead be only a thermal via. Furthermore, there may be conventional processing, such as for forming an RDL along a backside of die 400.

It should be appreciated that heat may be conducted more readily through thermal vias 431 passing through substrate 12, such as a bulk silicon substrate for example, than through one or more dielectric layers, such as one or more ILDs for example. For example, for a thermal via 432, such thermal via may be approximately 0.05 to 3 millimeters from a hot spot, which distance in combination with having to conduct heat laterally through at least one BEOL dielectric layer, as generally indicated with serpentine arrow 441, may make mitigating thermal build-up or hot spots problematic. In this example, a conductive trace 416 generally from well 413 to thermal via 432 may provide such conductivity; however, in other configurations there may not exist such a metal trace. However, backside thermal vias 431 may be placed close to a hot spot, and heat may be more readily conducted, as generally indicated with serpentine arrows 442, to such thermal vias 431 through a short distance in a silicon layer as compared with a substantially longer distance through at least one BEOL dielectric layer. Furthermore, silicon or another semiconductor material may be more readily thermally conductive than such at least one BEOL dielectric layer. Along those lines, even without thermal vias 431, heat transfer through a silicon substrate to a lower surface 16 may be more efficient than heat transfer through at least one BEOL dielectric or insulative layer to a thermal via spaced away from a hot spot. So, with addition of thermal vias 431, an even more efficient heat transfer may be provided than just passing through substrate 12.

Figure 5:
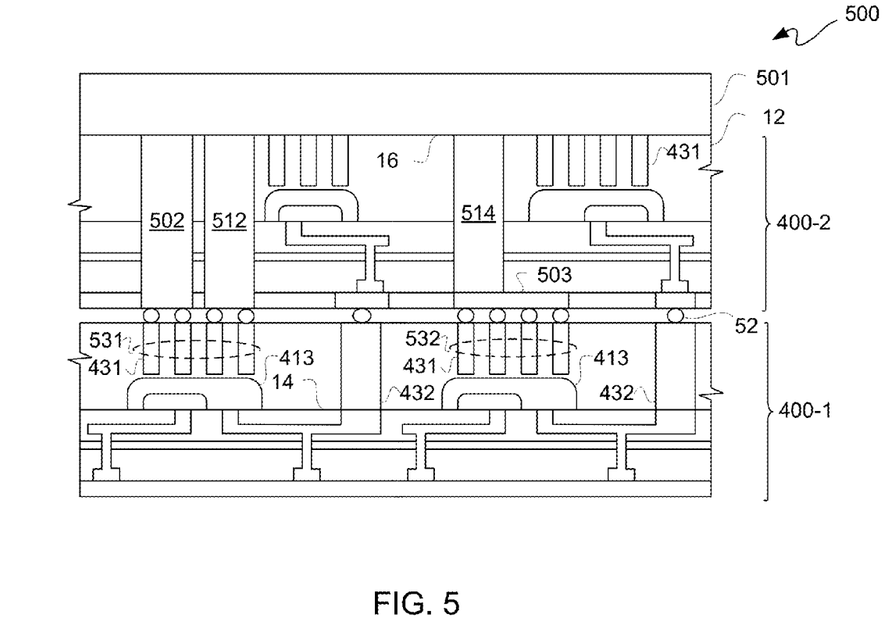
FIG. 5 is a schematic diagram of a cross-sectional view depicting an exemplary portion of a 3D stacked IC.

FIG. 5 is a schematic diagram of a cross-sectional view depicting an exemplary portion of a 3D stacked IC 500. Handling wafer 401 of FIGS. 4A through 4D has been removed, such as by de-bonding for example, and dies 400-1 and 400-2 are coupled to one another through die-to-die interconnects, such as microbumps 52 for example. Moreover, a heat sink or heat spreader 501 is coupled to a lower surface 16 of die 400-2.

Dies 400-1 and 400-2 may be examples of dies 400 as having thermal vias 431. In this example, die 400-1 includes a set of thermal vias 531 and a set of thermal vias 532 of thermal vias 431. A set of microbumps 52 may correspondingly interconnect thermal vias 431 of set of thermal 531 of die 400-1 to one or more through die vias of die 400-2. In this example, two thermal vias 431 of set of thermal vias 531 of die 400-1 are interconnected to a through die via 502 of die 400-2, and another two thermal vias 431 of set of thermal vias 531 are interconnected to a through die via 512 of die 400-2. In this example, through die vias 502 and 512 are thermal vias each of which is wider than each of thermal vias 431. Thus, ends of thermal vias 431 may be coupled to at least one through die via for thermal conductivity.

Furthermore, in this example, a set of microbumps 52 may correspondingly interconnect or have a denser pitch than thermal vias 431 of set of thermal vias 532 of die 400-1 to a pad 503 of die 400-2, and such pad 503 may be coupled to one or more through die vias of die 400-2. For thermal vias 432 for example, microbumps 52 may have a denser pitch, which may include bridging of microbumps, to increase heat transfer area or volume. In this example, four thermal vias 431 of set of thermal vias 532 of die 400-1 are interconnected to a pad 503 of die 400-2 and such pad 503 is coupled to a through die via 514 of die 400-2. In this example, through die via 514 is a thermal via which is wider than each of thermal vias 431 but narrower than pad 503.

Through die vias 502, 512, and 514 of die 400-2 may be coupled to a heat sink 501. Thermal through die vias 502, 512, and 514 of die 400-2 may or may not be electrically connected, such as to a ground bus for example. Furthermore, though sets of four thermal vias 431 are illustratively depicted in cross-section, it should be understood that many more than four thermal vias may be present in an array of thermal vias. Furthermore, for a top die of a stack, such as die 400-2 for example, ends of thermal vias 431 along a lower surface 16 of a substrate 12 may be coupled to heat sink 501.

Figure 6A:
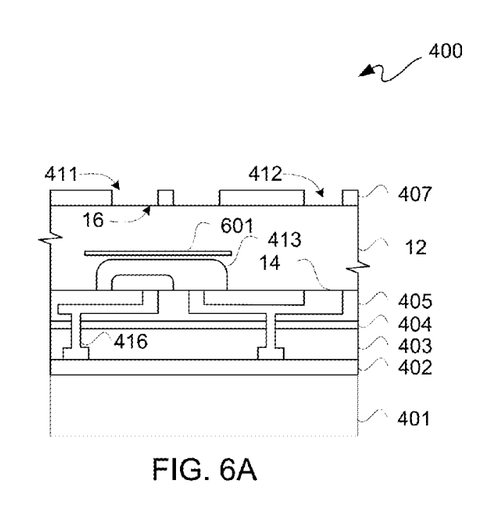
FIGS. 6A through 6C is a schematic diagram of a cross-sectional view depicting another exemplary portion of a successively processed in-process die for a 3D stacked IC die coupled to a handling wafer.
Figure 6B:
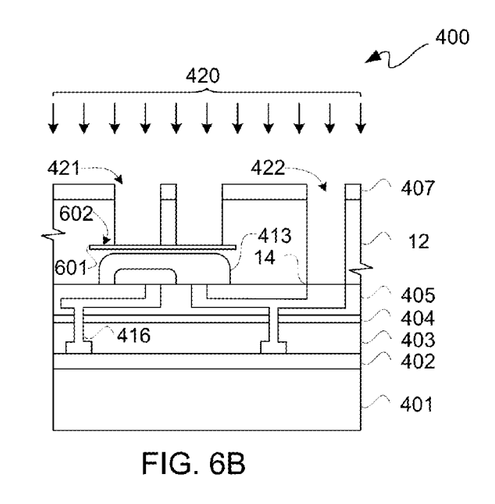
Figure 6C:
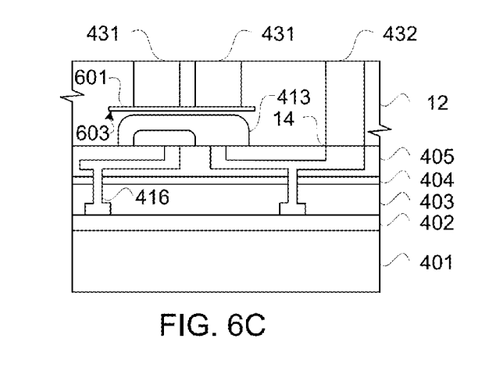

FIG. 6A is a schematic diagram of a cross-sectional view depicting an exemplary portion of an in-process die 400 for a 3D stacked IC, which may be coupled to a handling wafer or carrier 401. FIGS. 6B and 6C are the schematic diagram of FIG. 6A after successive processing operations for formation of this exemplary die 400. Accordingly, with simultaneous reference to FIGS. 6A through 6C, formation of die 400 is further described. Additionally, as FIGS. 6A through 6C share some description with FIGS. 4A through 4C, such description is generally not repeated for purposes of clarity and not limitation.

In this example, substrate 12 is a semiconductor-on-insulator substrate having a buried dielectric layer 601 obtained from a partial semiconductor-on-insulator wafer. More particularly, in this example, substrate 12 is obtained from a partial semiconductor-on-insulator wafer. For purposes of clarity, a silicon-on-insulator ("SOI") substrate 12 is described; however, other types of semiconductive materials may be used in other implementations.

Openings 411 and 412 along a lower surface 16 of substrate 12 may be used for etching vias 421 and 422, respectively, with an etch 420. Because buried dielectric layer 601 may provide an etch stop layer for etch 420 for etching vias 421, different etching rates due to different aspect ratios with DRIE may or may not be used. Along those lines, other types of etches less affected by differences in aspect ratios may be used. Furthermore, along those lines, openings 411 and vias 421 of FIG. 6B may be formed more widely than those of FIG. 4B, as a larger plated area may provide greater thermal conductivity. After a plating operation, such as copper plating, to form via structures 431 and 432 respectively in vias 421 and 422 more surface area for thermal conduction of heat away from a transistor or hotspot, which may be associated with well 413, may be provided.

Accordingly, a substrate 12 of die 400 may have a plurality of thermal vias 431 extending from a lower surface 16 of such substrate 12 to a lower surface 602 of buried dielectric layer 601 exposed by etch 420. Along those lines, ends of thermal vias 431 may stop on lower surface 602 of buried dielectric layer 601 of substrate 12. Optionally, via structures 431 may be lined with a liner layer and/or a barrier layer, as previously described herein.

Spacing or gapping between lower surface 602 and well 413 may be less than or equal to approximately 20 microns in distance. In some implementations, such spacing between lower surface 602 and well 413 may be 3 microns or less. Even though a gap of substrate 12 material is illustratively depicted between buried dielectric layer 601 and well 413, in other implementations well 413 may extend to an upper surface 603 of buried dielectric layer 601. Again, thermal vias 431 may be etched simultaneously with etch 420 to form one or more signal vias, such as signal via 432 for example. For this example, widths of thermal vias 431 may be in a range of approximately 0.5 to 300 microns. Wider vias may be formed due to precision afforded by having an etch stop layer. Along those lines, thermal vias 431 may be formed as an array, such as previously described with reference to FIG. 4E, with a pitch in a range of approximately 1 to 200 microns. Moreover, for this example and the example of FIG. 8B, width of signal via 432 may be in a range of approximately 0.1 to 10 times a width of thermal vias 431.

In this example, substrate 12 has a signal via 432 which is a through substrate via, as it extends between surfaces 14 and 16 of substrate 12. Though thermal vias 431 and signal via 432 are illustratively depicted as being completely filled, though they may not be. In other configurations, there may be voids and/or vias may be lined with a thermally and electrically conductive material, such as another metal, a metal compound or alloy for example, or other material having sufficient electrical and thermal conductive properties. Furthermore, even though copper has been described herein as such thermally and electrically conductive material, other thermally and electrically conductive materials may be used in other examples.

Figure 7A:
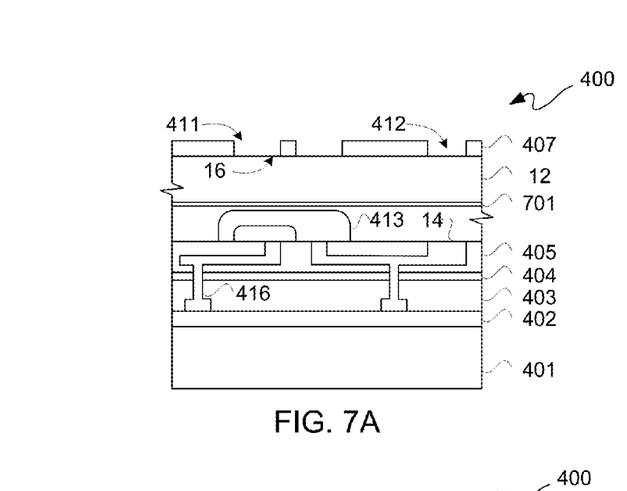
FIGS. 7A through 7D is a schematic diagram of a cross-sectional view depicting yet another exemplary portion of a successively processed in-process die for a 3D stacked IC die coupled to a handling wafer.
Figure 7B:
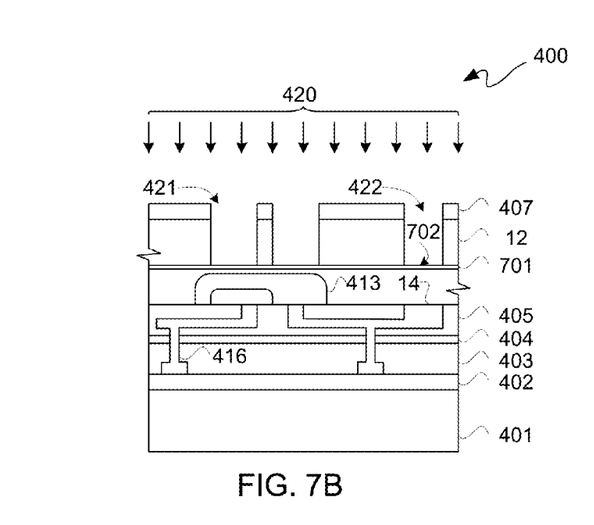
Figure 7C:
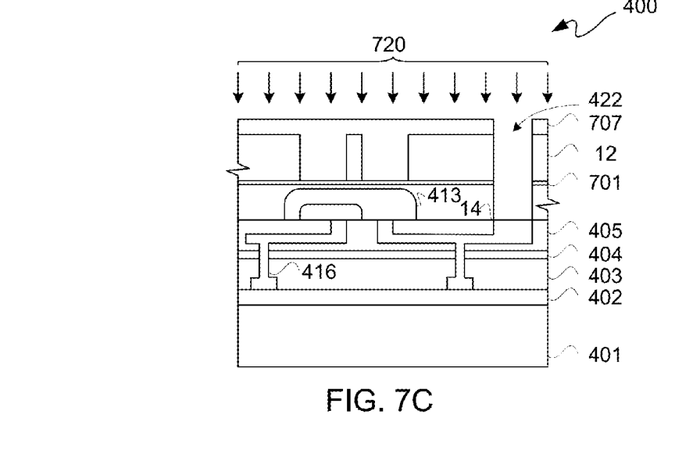
Figure 7D:
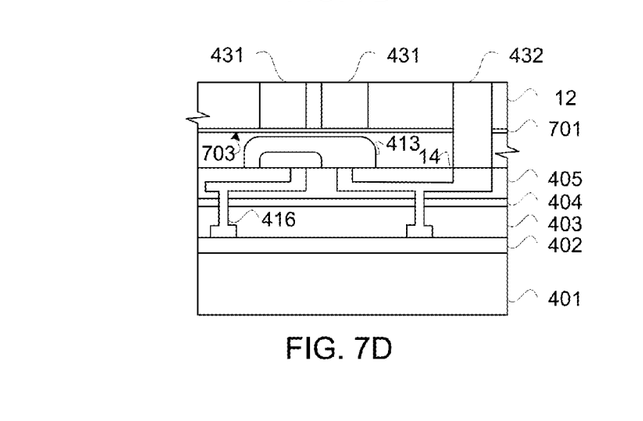

FIG. 7A is a schematic diagram of a cross-sectional view depicting an exemplary portion of an in-process die 400 for a 3D stacked IC, which may be coupled to a handling wafer or carrier 401. FIGS. 7B through 7D are the schematic diagram of FIG. 7A after successive processing operations for formation of this exemplary die 400. FIGS. 7A through 7D generally correspond to FIGS. 6A through 6C for this formation of die 400. As FIGS. 7A through 7D share some description with FIGS. 6A through 6C, such description is generally not repeated for purposes of clarity and not limitation. Accordingly, with simultaneous reference to FIGS. 7A through 7D, formation of die 400 is further described.

In this example, substrate 12 is a semiconductor-on-insulator substrate having a buried dielectric layer 701. However, in this example, substrate 12 is not obtained from what is known as a partial silicon-on-insulator wafer, but rather such buried dielectric layer 701 covers the entire area of a wafer to which it is included, as is known.

Openings 411 and 412 along a lower surface 16 of substrate 12 may be used for etching vias 421 and 422, respectively, with an etch 420. Because buried dielectric layer 701 may provide an etch stop layer for etch 420 for etching vias 421 and 422, different etching rates due to different aspect ratios with DRIE may or may not be used. Along those lines, other types of etches less affected by differences in aspect ratios may be used.

A masking layer 707 may be deposited and patterned to fill vias 421 and 422, while via 422 after being filled with a resist is re-opened expositing a lower surface 702 portion of buried dielectric layer 701. An etch 720 may follow to etch through buried dielectric layer 701 and then switch back to etch 420 again, such as an in situ change in etch chemistry, to etch a portion of substrate 12 to form a through substrate via 422 down to upper surface 14 of substrate 12. A plating operation, such as copper plating, to form via structures 431 and 432 respectively in vias 421 and 422 may follow.

Accordingly, a substrate 12 of die 400 may have a plurality of thermal vias 431 extending from a lower surface 16 of such substrate 12 to a lower surface 702 of buried dielectric layer 701 exposed by etch 420. Along those lines, ends of thermal vias 431 may stop on lower surface 702 of buried dielectric layer 701 of substrate 12. Optionally, via structures 431 may be lined with a liner layer and/or a barrier layer, as previously described herein.

Spacing or gapping between lower surface 702 and well 413 may be less than or equal to approximately 20 microns in distance. In some implementations, such spacing between lower surface 702 and well 413 may be 3 microns or less. Even though a gap of substrate 12 material is illustratively depicted between buried dielectric layer 701 and well 413, in other implementations well 413 may extend to an upper surface 703 of buried dielectric layer 701. For this example, widths of thermal vias 431 may be in a range of approximately 0.1 to 100 microns, where larger widths are facilitated by having an etch stop layer. Along those lines, thermal vias 431 may be formed as an array with a pitch in a range of approximately 1 to 200 microns. Thus, widths of thermal vias 431 may be equal to or less than a width of through substrate via 432. Moreover, for this example, width of signal via 432 may be in a range of approximately 0.1 to 10 times a width of thermal vias 431.

In this example, substrate 12 has a signal via 432 which is a through substrate via, as it extends between surfaces 14 and 16 of substrate 12. Through substrate via 432 extends through buried dielectric layer 701 down to upper surface 14 of substrate 12. Through substrate via 432 extends through a gap between dielectric islands or portions of buried dielectric layer 701. Likewise, a through substrate via 432 of FIG. 6C extends through a gap between dielectric islands or portions of buried dielectric layer 601.

Though thermal vias 431 and signal via 432 are illustratively depicted as being completely filled, though they may not be. In other configurations, there may be voids and/or vias may be lined with a thermally and electrically conductive material, such as another metal, a metal compound or alloy for example, or other material having sufficient electrical and thermal conductive properties. Furthermore, even though copper has been described herein as such thermally and electrically conductive material, other thermally and electrically conductive materials may be used in other examples.

Figure 8A:
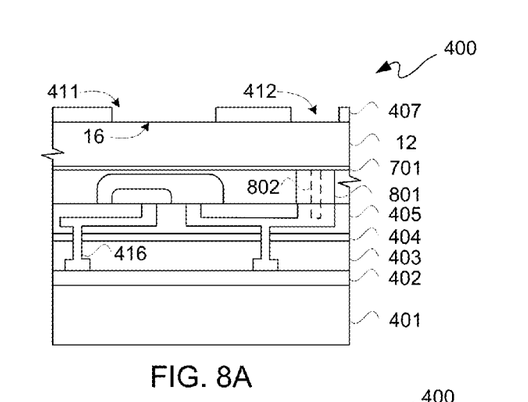
FIGS. 8A through 8D is a schematic diagram of a cross-sectional view depicting still yet another exemplary portion of a successively processed in-process die for a 3D stacked IC die coupled to a handling wafer.
Figure 8B:
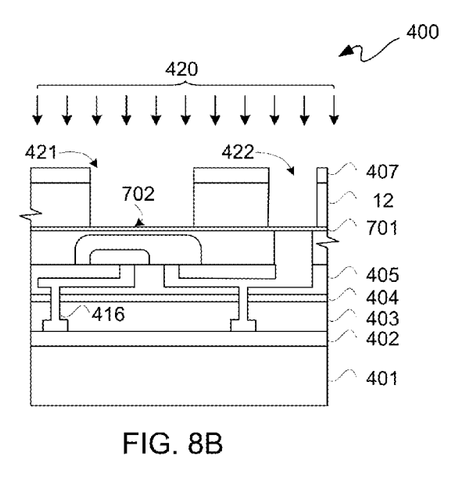
Figure 8C:
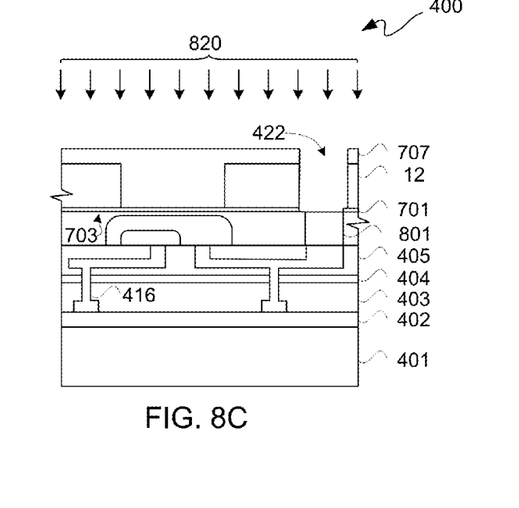
Figure 8D:
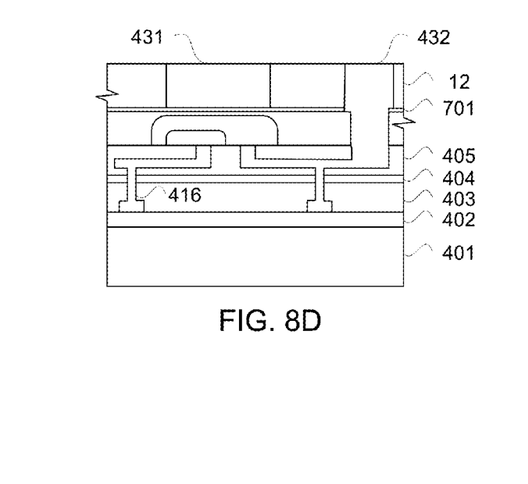

FIG. 8A is a schematic diagram of a cross-sectional view depicting an exemplary portion of an in-process die 400 for a 3D stacked IC, which may be coupled to a handling wafer or carrier 401. FIGS. 8B through 8D are the schematic diagram of FIG. 8A after successive processing operations for formation of this exemplary die 400. FIGS. 8A through 8D generally correspond to FIGS. 7A through 7D for this formation of die 400. As FIGS. 8A through 8D share some description with FIGS. 7A through 7D, such description is generally not repeated for purposes of clarity and not limitation. Accordingly, with simultaneous reference to FIGS. 8A through 8D, formation of die 400 is further described.

In this example, substrate 12 is a semiconductor-on-insulator substrate having a buried dielectric layer 701. A via structure 801 is formed in substrate 12. Even though a single via structure 801 is illustratively depicted, multiple via structures 801 may be formed as generally indicated by dashed line 802. Along those lines, a masking layer (not shown) may be deposited and patterned on upper surface 14 of substrate 12 for forming an opening for etching down to buried dielectric layer 701, and such via may be subsequently plated with a thermally conductive material to provide via structure 801.

After BEOL operations, die 400 may be inverted and openings 411 and 412 along a lower surface 16 of substrate 12 may be patterned in masking layer 407. Openings 411 and 412 may be used for etching vias 421 and 422, respectively, with an etch 420, where vias extend to a lower surface 702 of buried dielectric layer 701. In this example, rather than array of vias 421, a single via 421 is etched. Because buried dielectric layer 701 may provide an etch stop layer for etch 420 for etching vias 421 and 422, different etching rates due to different aspect ratios with DRIE may or may not be used. Along those lines, other types of etches less affected by differences in aspect ratios may be used.

A masking layer 707 may be deposited and patterned to fill vias 421 and 422, while via 422 after being filled with a resist is re-opened expositing a lower surface 702 portion of buried dielectric layer 701. An etch 820 may follow to etch through buried dielectric layer 701 to temporarily expose a lower end surface of via structure 801, which extends down to upper surface 14 of substrate 12. A plating operation, such as copper plating, to form via structures 431 and 432 respectively in vias 421 and 422 may follow.

Accordingly, a substrate 12 of die 400 may have a thermal via 431 extending from a lower surface 16 of such substrate 12 to a lower surface 702 of buried dielectric layer 701 exposed by etch 420. Along those lines, an end of thermal via 431 may stop on lower surface 702 of buried dielectric layer 701 of substrate 12. Optionally, via structure 431 may be lined with a liner layer and/or a barrier layer, as previously described herein.

Spacing or gapping between lower surface 702 and well 413 may be less than or equal to approximately 20 microns in distance. In some implementations, such spacing between lower surface 702 and well 413 may be 3 microns or less. Even though a gap of substrate 12 material is illustratively depicted between buried dielectric layer 701 and well 413, in other implementations well 413 may extend to an upper surface 703 of buried dielectric layer 701. For this example, width of thermal via 431 may be in a range of approximately 1 to 200 microns. Widths of thermal via 431 may be equal to or greater than a width of through substrate via 432. Moreover, for this example, width of signal via 432 may be in a range of approximately 0.01 to 10 times a width of thermal via 431.

In this example, substrate 12 has a signal via 432 which is a through substrate via, as it extends between surfaces 14 and 16 of substrate 12. Through substrate via 432 extends through buried dielectric layer 701 down to upper surface 14 of substrate 12. Through substrate via 432 extends through a gap between dielectric islands or portions of buried dielectric layer 701.

Though thermal vias 431 and signal via 432 are illustratively depicted as being completely filled, though they may not be. In other configurations, there may be voids and/or vias may be lined with a thermally and electrically conductive material, such as another metal, a metal compound or alloy for example, or other material having sufficient electrical and thermal conductive properties. Furthermore, even though copper has been described herein as such thermally and electrically conductive material, other thermally and electrically conductive materials may be used in other examples.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An apparatus, comprising:
   a three-dimensional stacked integrated circuit having a first die;
   wherein a substrate of the first die has at least one thermal via structure extending from a first surface of the substrate toward a well of the substrate without extending to the well and without extending through the substrate;
   wherein a first end of the at least one thermal via structure is proximate to the well of the substrate for conduction of heat away therefrom through the at least one thermal via structure to a second end of the at least one thermal via structure;
   wherein the substrate includes a semiconductor-on-insulator substrate having a buried dielectric layer; and
   wherein the first end stops on the buried dielectric layer of the substrate.

2. The apparatus according to claim 1, further comprising:
   a pad associated with a second surface of the substrate opposite the first surface of the substrate;
   wherein the at least one thermal via structure is a plurality of thermal via structures;
   wherein widths of the plurality of thermal via structures are each less than widths of through substrate via structures of the substrate; and
   wherein the pad is an etch stop layer for the through substrate via structures.

3. The apparatus according to claim 2, wherein the widths of the plurality of thermal via structures are in a range of approximately 0.5 to 100 microns.

4. The apparatus according to claim 3, wherein:
   the plurality of thermal via structures are in a high-density array with a pitch in a range of approximately 1 to 200 microns; and
   the width of the at least one through substrate via structure is in a range of approximately 1 to 5 times any of the widths of the plurality of thermal via structures.

5. The apparatus according to claim 1, wherein depth of the at least one thermal via structure is approximately 1 to 200 microns which is approximately 1 to 20 microns less than a depth of the at least one through substrate via structure.

6. The apparatus according to claim 1, wherein the at least one through substrate via structure is a signal via structure.

7. The apparatus according to claim 1, wherein the at least one through substrate via structure is a thermal via structure.

8. The apparatus according to claim 1, wherein the first end is within 20 microns inclusive of the well.

9. The apparatus according to claim 1, wherein the buried dielectric layer is of a partial silicon-on-insulator wafer.

10. The apparatus according to claim 1, wherein the at least one through substrate via structure extends through the buried dielectric layer.

11. The apparatus according to claim 10, wherein the at least one through substrate via structure extends through a gap between dielectric islands of the buried dielectric layer.

12. The apparatus according to claim 1, further comprising:
    a pad associated with a second surface of the substrate opposite the first surface of the substrate;
    wherein the at least one thermal via structure is a plurality of thermal via structures;
    the plurality of thermal via structures extending from the first surface of the substrate toward the well of the substrate without extending to the well and without extending through the substrate;
    first ends of the plurality of thermal via structures are proximate to the well of the substrate for conduction of heat away therefrom through the plurality of thermal via structures to corresponding second ends of the plurality of thermal via structures; and
    the second ends of the plurality of thermal via structures are coupled to a heat sink.

13. The apparatus according to claim 12, wherein an air gap is located between sidewalls of the plurality of thermal via structures and the substrate to provide fins.

* * * * *